(12) United States Patent
Briggs et al.

(10) Patent No.: US 9,837,305 B1
(45) Date of Patent: Dec. 5, 2017

(54) FORMING DEEP AIRGAPS WITHOUT FLOP OVER

(71) Applicant: International Business Machines Corporation, Armonk, NY (US)

(72) Inventors: Benjamin D. Briggs, Waterford, NY (US); Lawrence A. Clevenger, Rhinebeck, NY (US); Bartlet H. DeProspo, Goshen, NY (US); Huai Huang, Saratoga, NY (US); Christopher J. Penny, Saratoga Springs, NY (US); Michael Rizzolo, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/202,475

(22) Filed: Jul. 5, 2016

(51) Int. Cl.
| | |
|---|---|
| *H01L 21/00* | (2006.01) |
| *H01L 21/76* | (2006.01) |
| *H01L 21/44* | (2006.01) |
| *H01L 29/04* | (2006.01) |
| *H01L 31/036* | (2006.01) |
| *H01L 21/768* | (2006.01) |
| *H01L 23/522* | (2006.01) |
| *H01L 23/532* | (2006.01) |

(52) U.S. Cl.
CPC .... *H01L 21/7682* (2013.01); *H01L 21/76802* (2013.01); *H01L 21/76877* (2013.01); *H01L 23/5226* (2013.01); *H01L 23/5329* (2013.01); *H01L 23/53228* (2013.01)

(58) Field of Classification Search
CPC ......... H01L 21/76802; H01L 21/76877; H01L 21/7682; H01L 23/5226; H01L 23/5329; H01L 23/53228
USPC .............................. 257/75; 438/98, 430, 653
See application file for complete search history.

(56) References Cited

U.S. PATENT DOCUMENTS

| | | | |
|---|---|---|---|
| 6,908,829 B2 | 6/2005 | Hussein et al. | |
| 7,595,555 B2 | 9/2009 | Clarke et al. | |
| 7,790,601 B1* | 9/2010 | Choi ................. | H01L 21/31144 257/E21.587 |
| 8,183,694 B2 | 5/2012 | Clevenger et al. | |
| 8,497,203 B2* | 7/2013 | Chen ................... | H01L 21/7682 257/334 |
| 8,575,024 B2 | 11/2013 | Li et al. | |
| 8,907,491 B2 | 12/2014 | Van Veenhuizen | |
| 9,159,602 B2 | 10/2015 | Andry et al. | |
| 2011/0210449 A1 | 9/2011 | Nitta et al. | |

(Continued)

*Primary Examiner* — David S Blum
(74) *Attorney, Agent, or Firm* — Law Offices of Ira D. Blecker, P.C.

(57) ABSTRACT

A semiconductor structure that includes: a semiconductor substrate having a semiconductor base and back end of the line (BEOL) wiring layers; a dielectric cap layer on the semiconductor base; trenches on the dielectric cap layer, each of the trenches including dielectric walls, a dielectric bottom in contact with the dielectric cap layer and a metal filling a space between the dielectric walls; air gap openings on the dielectric cap layer and interspersed with the trenches, each air gap opening between the dielectric wall from one metal trench and adjacent to the dielectric wall of a second metal, the dielectric cap layer forming a bottom of the air gap openings; and a second dielectric cap layer formed over the trenches and over the air gap openings, the second dielectric cap layer pinching off each air gap opening.

20 Claims, 13 Drawing Sheets

(56) References Cited

U.S. PATENT DOCUMENTS

| | | |
|---|---|---|
| 2011/0237075 A1 | 9/2011 | Nitta et al. |
| 2014/0225186 A1 | 8/2014 | Abou-Khalil et al. |
| 2014/0252625 A1 | 9/2014 | Ting et al. |
| 2015/0162277 A1* | 6/2015 | Zhang ................ H01L 23/5226 257/773 |
| 2015/0162278 A1 | 6/2015 | Zhang et al. |

* cited by examiner

FORMING DEEP AIRGAPS WITHOUT FLOP OVER

BACKGROUND

The present exemplary embodiments pertain to semiconductor structures and methods of fabricating the semiconductor structures and, more particularly, pertain to back end of the line (BEOL) interconnect structures having air gaps and methods of manufacturing them.

BEOL interconnect structures are typically multilevel structures containing patterns of metal wiring layers encapsulated in a dielectric insulating material.

A continuing and ongoing trend in the semiconductor field is the ever-increasing density of circuit components in integrated circuits. More and more circuit components are being designed within a given integrated circuit area. Techniques have been developed to substantially reduce the sizes of active devices, metal lines, and other components.

A problem with many current integrated circuit designs is capacitance. Airgaps between metal wiring lines have emerged as a leading option for reducing capacitance in metal interconnects.

BRIEF SUMMARY

The various advantages and purposes of the exemplary embodiments as described above and hereafter are achieved by providing, according to an aspect of the exemplary embodiments, a method of forming airgaps in a back end of the line (BEOL) wiring layer of a semiconductor device, comprising: providing a semiconductor substrate having a semiconductor base; depositing a sacrificial dielectric layer for a BEOL wiring layer on the semiconductor base; selectively etching the sacrificial dielectric layer to form openings in the sacrificial dielectric layer, each opening having walls and a bottom; conformally forming a dielectric material in the openings, the dielectric material conformally formed on the walls and the bottom of each of the openings; depositing a metal on the conformally formed dielectric material in the openings to form metal-filled openings; removing the sacrificial dielectric layer from at least a portion of the semiconductor substrate to form air gap openings extending to a level equal to the bottom of each of the openings, the air gap openings being adjacent to the metal-filled openings and sharing a common dielectric wall with each adjacent metal-filled opening; and forming a dielectric cap layer over the air gap openings to pinch off the air gap openings.

According to another aspect of the exemplary embodiments, there is provided a method of forming airgaps in a back end of the line (BEOL) wiring layer of a semiconductor device, comprising: providing a semiconductor substrate having a semiconductor base and a dielectric cap layer in a BEOL wiring layer; depositing a sacrificial dielectric layer on the dielectric cap layer; selectively etching the sacrificial dielectric layer to form openings in the sacrificial dielectric layer to expose the dielectric cap layer such that the remaining sacrificial dielectric layer forms pillars of the sacrificial dielectric layer, each opening having walls and a bottom; conformally forming a dielectric material in the openings, the dielectric material conformally formed on walls of the opening and the dielectric cap layer exposed in the openings; depositing a metal on the conformally formed dielectric material in the openings to form metal-filled openings; removing the pillars of the sacrificial dielectric layer from at least a portion of the semiconductor substrate to form air gap openings having walls of the dielectric material and exposing the dielectric cap layer, the air gap openings being adjacent to the metal-filled openings and sharing a common dielectric wall with each adjacent metal-filled opening; and forming a second dielectric cap layer over the air gap openings to pinch off the air gap openings.

According to a further aspect of the exemplary embodiments, there is provided a semiconductor structure comprising: a semiconductor substrate having a semiconductor base and a plurality of back end of the line (BEOL) wiring layers; a dielectric cap layer on the semiconductor base; a plurality of trenches on the dielectric cap layer, each of the trenches including dielectric walls, a dielectric bottom in contact with the dielectric cap layer and a metal filling a space between the dielectric walls; a plurality of air gap openings on the dielectric cap layer and interspersed with the plurality of trenches, each air gap opening between the dielectric wall from one metal trench and adjacent to the dielectric wall of a second metal, the dielectric cap layer forming a bottom of the plurality of air gap openings; and a second dielectric cap layer formed over the plurality of trenches and over the plurality of air gap openings, the second dielectric cap layer pinching off each air gap opening.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2 to 9 are crossectional views illustrating a process for forming the trenches and a via of FIG. 1 in a semiconductor structure wherein:

FIGS. 13 to 20 are crossectional views illustrating an alternative process for forming the trenches and a via of FIG. 1 in a semiconductor structure wherein:

DETAILED DESCRIPTION

It has been found that currently proposed airgap schemes are limited in how deep an airgap can be created before risking the airgap beginning to undercut the trench. Airgap undercut can lead to trench flopover during airgap formation.

Flopover may occur when the wiring trench or any supporting dielectric has been weakened to the extent that the wiring trench begins to tilt into the airgap, thereby decreasing the effectiveness of the airgap and potentially leading to shorting between the wires.

Accordingly, a solution has been proposed in which a dielectric backfill has been utilized to provide support for trenches and prevent airgap undercut and line flopover. Utilization of a dielectric backfill allows for formation of deeper airgaps without the risk of flopover. The dielectric for the backfill can be chosen to optimize capacitance, damage resistance and mechanical properties. The present solution further utilizes a sacrificial dielectric which may remain in the final structure or be fully removed.

Figure 1:
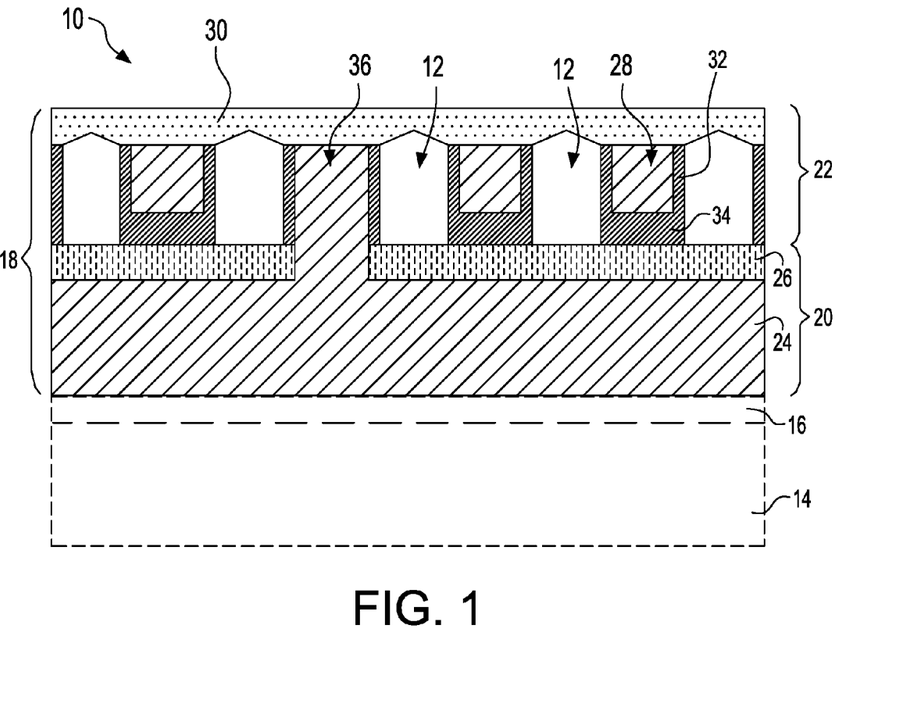
FIG. 1 is a crossectional view of an exemplary embodiment of a semiconductor structure having airgaps.

Referring to the Figures in more detail, and particularly referring to FIG. 1, there is illustrated in cross section an exemplary embodiment of a semiconductor structure 10 having airgaps 12. The semiconductor structure 10 includes a semiconductor base 14 which may include the front end of the line (FEOL) components such as transistors and capacitors and a middle of the line (MOL) portion 16 which may include the components, such as contact arrays, that transition from the semiconductor base 14 to the back end of the line (BEOL) wiring layers 18. Details of the semiconductor base 14 and the MOL portion 16 are not shown in detail as these are not germane to the exemplary embodiments.

Two BEOL wiring layers 18 are shown in FIG. 1. One BEOL layer 20 illustrates a wiring trench 24 and a cap layer 26. A second BEOL layer 22 illustrates additional wiring trenches 28 and another cap layer 30. Second BEOL layer 22 further illustrates the airgaps 12 between the wiring trenches 28. It should be understood that the wiring trenches in this depiction alternate in direction so that the wiring trench 24 is viewed in the plane of the page while the wiring trenches 28 are viewed perpendicular to the wiring trench 24 and are coming out of the page. These wiring orientations are chosen for clarity, but are not required for the current invention.

Second BEOL layer 22 also illustrates a via 36 which extends into wiring trench 24 to provide electrical contact between BEOL layer 20 and BEOL layer 22.

The airgaps 12 may be in all BEOL layers or just in some BEOL layers or even in just parts of the BEOL layers. For example, the airgaps 12 may be in BEOL layer 20 but are not viewable due to the cross sectional view. Alternatively, the airgaps 12 may not be in BEOL layer 20 if not necessary to achieving the desired electrical characteristics of the BEOL layer 20.

The airgaps 12 may extend fully from the cap layer 30, which has pinched off the airgaps 12, to the cap layer 26. The wiring trenches 28 include dielectric walls 32 and a dielectric bottom 34 so that the wiring trenches 28 are essentially encapsulated by the dielectric walls 32 and dielectric bottom 34 which together enable deep airgaps 12 without risking flopover of the wiring trenches 28.

Figure 10A:
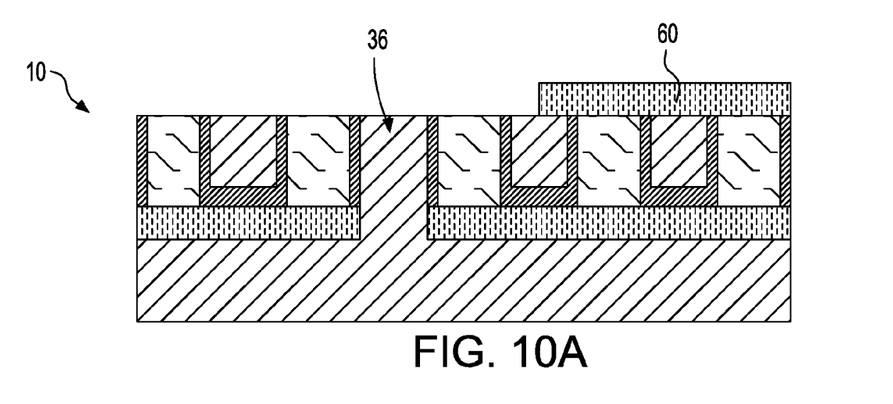
FIG. 10A, FIG. 10B and FIG. 10C are crossectional views illustrating a first process for removing a sacrificial dielectric material to form the airgaps of FIG. 1.
Figure 10B:
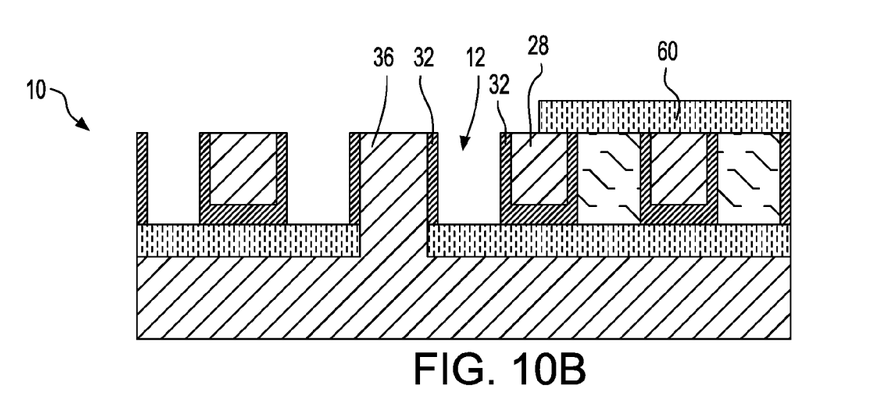
Figure 10C:
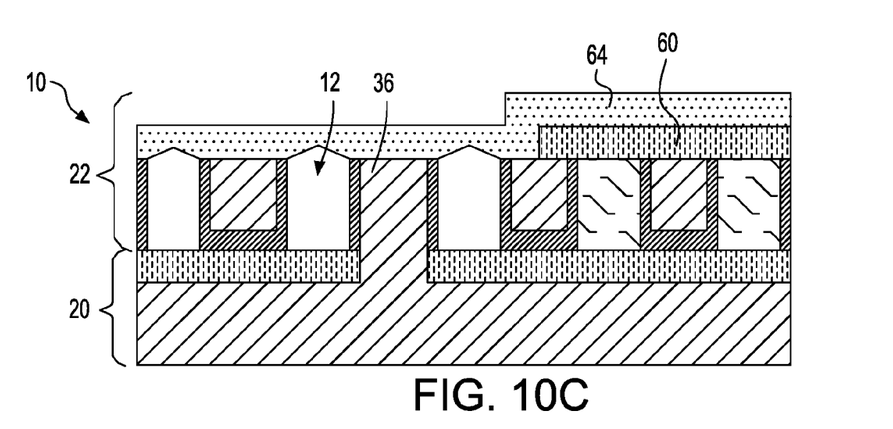
Figure 11A:
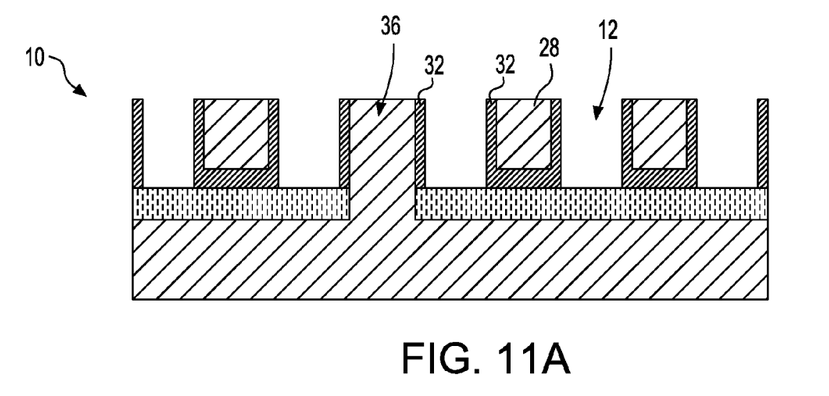
FIG. 11A and FIG. 11B are crossectional views illustrating a second process for removing a sacrificial dielectric material to form the airgaps of FIG. 1.
Figure 11B:
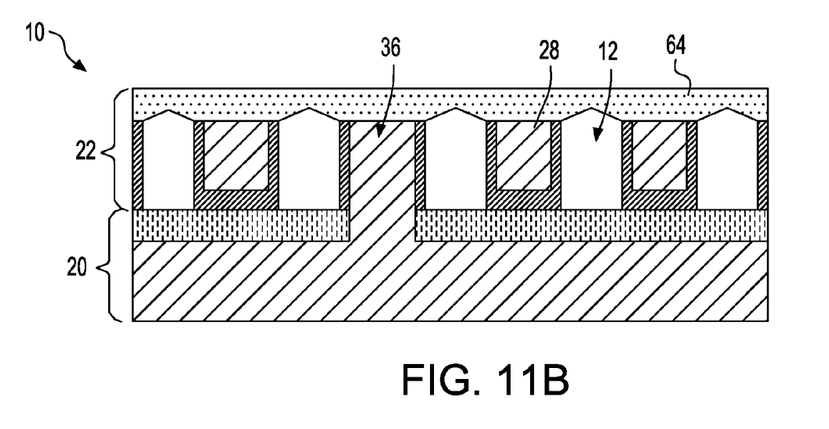

Referring now to FIGS. 2 to 9, there is illustrated a process for forming the trenches 28 and a via 36 of FIG. 1 in a semiconductor structure 10. FIGS. 10A to 10C illustrate a first process for removing a sacrificial material to form the airgaps 12 while FIGS. 11A to 11B illustrate a second process for removing the sacrificial material to form the airgaps 12.

The semiconductor base 14 and MOL portion 16 are not shown in FIGS. 2 to 9, 10A to 10C and 11A to 11B for clarity.

Figure 2:
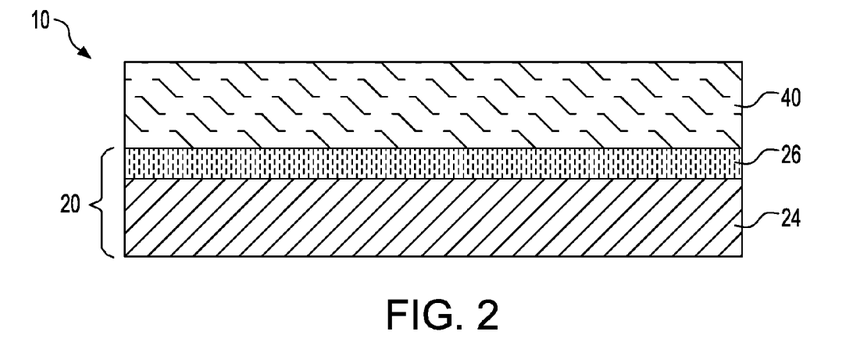
FIG. 2 is a crossectional view illustrating the formation of a sacrificial dielectric layer on a cap layer of a previous BEOL layer.

Referring to FIG. 2, BEOL layer 20 has been formed including wiring trench 24 and cap layer 26. The metal that comprises the wiring trench 24 is preferably copper but could be any other conductor that is now or hereafter used in BEOL layers. Cap layer 26 may be, for example, a silicon nitride and may have a thickness of about 20-50 nanometers (nm).

On top of cap layer 26 may be formed, for example by chemical vapor deposition (CVD) a sacrificial dielectric layer 40. The sacrificial dielectric layer 40 may be any dielectric material that is easily etched away and may be, for example, silicon oxide, silicon nitride or a dielectric material that may be made porous such as SiCOH. The sacrificial dielectric layer 40 may have a thickness in the range of 25 to 1000 nm, preferably about 100 nm.

Figure 3:
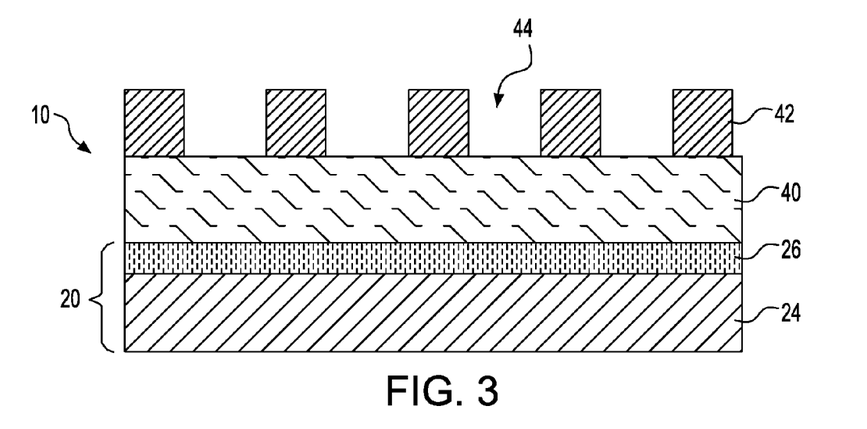
FIG. 3 is a crossectional view illustrating the patterning of a lithographic material on the sacrificial dielectric material.

Referring now to FIG. 3, a lithographic material 42 such as a photoresist has been deposited on the sacrificial dielectric layer 40 and then patterned to form openings 44. Openings 44 are where the wiring trenches will be formed in subsequent processing steps.

Figure 4:
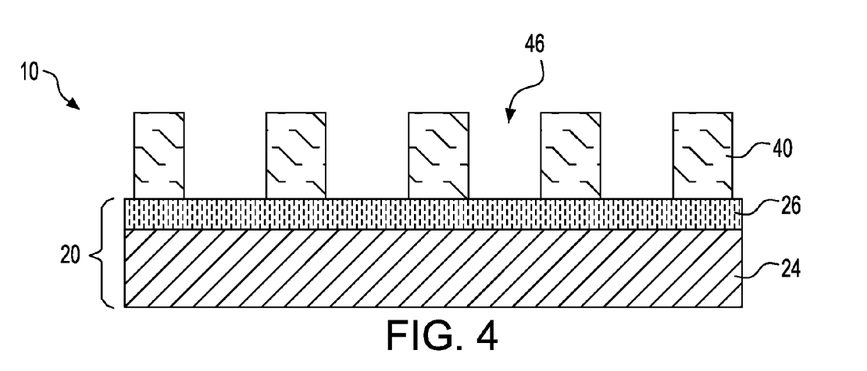
FIG. 4 is a crossectional view illustrating the etching of the sacrificial dielectric layer using the patterned lithographic material of FIG. 3 to form openings in the sacrificial dielectric material.

Thereafter, the semiconductor structure 10 undergoes an etching process, for example a dry etching process such as reactive ion etching (RIE), in which the openings 44 in the lithographic material 42 are propagated into the underlying sacrificial dielectric material 40 to form openings 46 in the sacrificial dielectric material 40. After the etching process, the lithographic material 42 may be conventionally stripped. As a result of the etching process, pillars of sacrificial dielectric material 40 are formed which will run parallel to the wiring trenches that will be formed in subsequent processing steps. In one exemplary embodiment, the openings 46 in the sacrificial dielectric material 40 extend all the way to the cap layer 26 so that the cap layer 26 is now exposed. The resulting structure is shown in FIG. 4.

Figure 5:
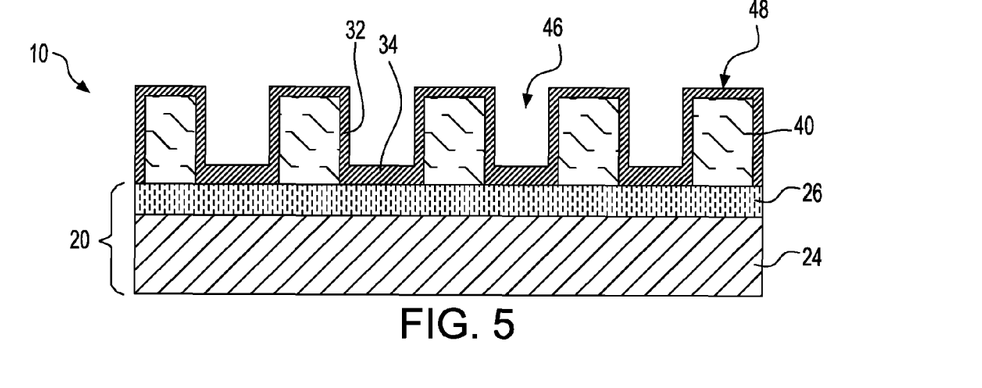
FIG. 5 is a crossectional view illustrating the formation of a conformal dielectric material in the openings of the sacrificial dielectric material.

Then, as illustrated in FIG. 5, a dielectric material 48, such as an oxide, is conformally formed on the pillars of the sacrificial dielectric material 40 and in the openings 46 of the sacrificial dielectric material 40. With respect to the openings 46 in the sacrificial dielectric material 40, the dielectric material 48 has walls 32 and a bottom 34 in contact with the cap layer 26. In one exemplary embodiment, the thickness of the walls 32 of the dielectric material is less than the thickness of the bottom 34 of the dielectric material 48. The dielectric material 32 on the sidewalls may have a thickness of 2 to 10 nm and the dielectric material 34 on the bottom may have a thickness of 2 to 40 nm in one embodiment.

The dielectric material may be deposited in two different ways to result in the conformally formed dielectric material 48. In one exemplary embodiment, the dielectric material 48 may be conformally deposited such as by a CVD process.

Figure 21A:
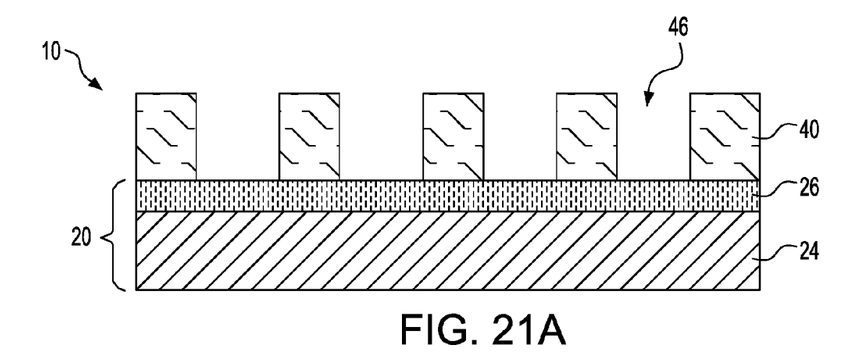
FIG. 21A, FIG. 21B and FIG. 21C are crossectional views illustrating an exemplary embodiment for forming a conformal dielectric layer using a flowable dielectric material.
Figure 21B:
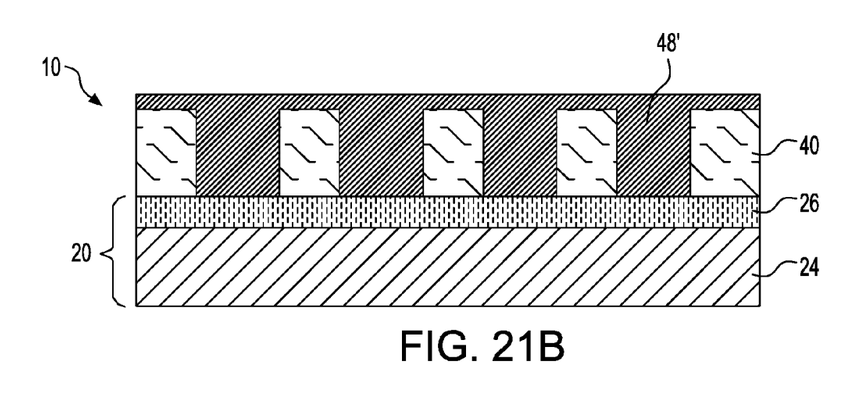
Figure 21C:
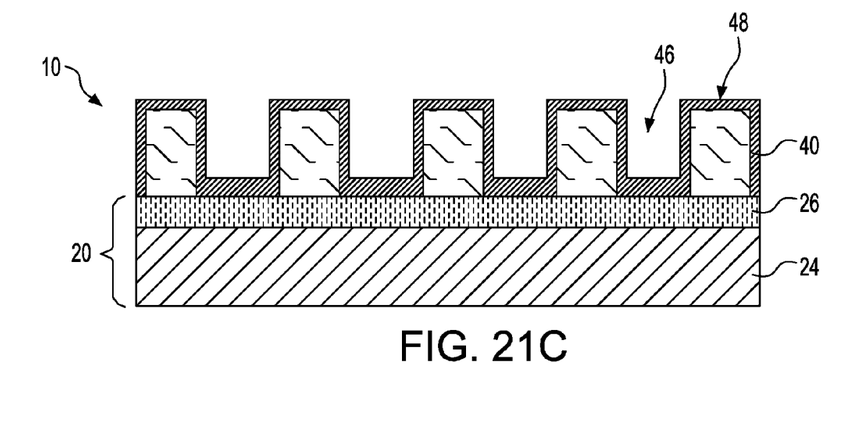

In another exemplary embodiment, as illustrated in FIGS. 21A to 21C, a flowable dielectric may be used followed by an etching process to result in the conformally formed dielectric material 48. FIG. 21A is the same as FIG. 4. In FIG. 21B, a flowable dielectric material 48' has been deposited over the sacrificial dielectric material 40 and in the openings 46. The flowable dielectric material 48' may be, for example, a spin-on dielectric material. Alternatively, the flowable dielectric material 48' may be deposited by a CVD process and then annealed to cause the dielectric material 48' to flow over the sacrificial dielectric material 40 and in the openings 46. The flowable dielectric material 48' may then be patterned and etched, for example, by a RIE process to result in the conformally formed dielectric material 48 shown in FIG. 21C and also FIG. 5.

Alternatively, a combination of conformally deposited dielectric and a flowable dielectric may be used to achieve the desired thicknesses for the dielectric material 32 on the sidewall and the dielectric material 34 on the bottom.

Figure 6:
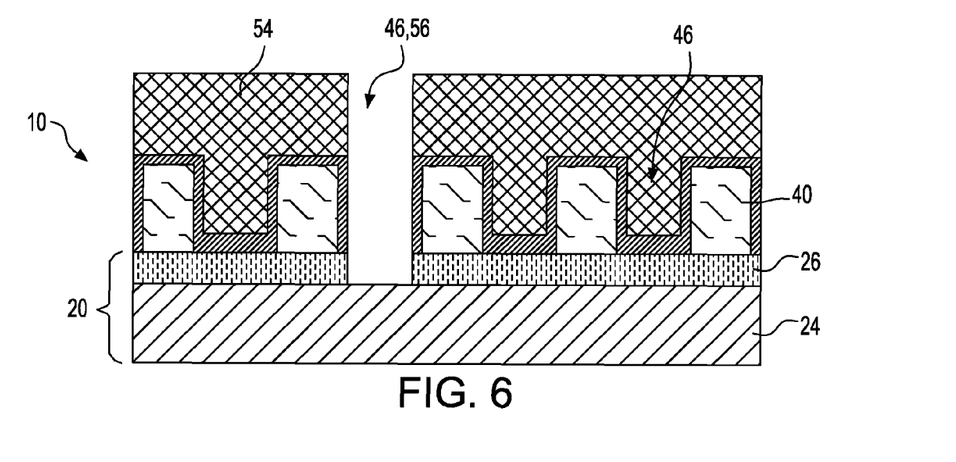
FIG. 6 is a crossectional view illustrating the patterning of a lithographic material and etching through the patterned lithographic material to form a via opening.
Figure 7:
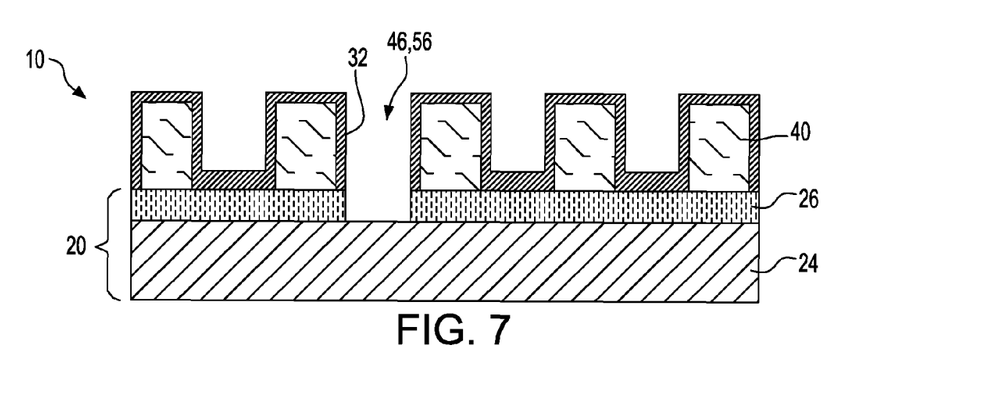
FIG. 7 is a crossectional view illustrating the semiconductor structure of FIG. 6 with the lithographic material removed.

In one exemplary embodiment, a via may be formed to connect wiring trench 24 in BEOL layer 20 to a wiring trench or another via in a BEOL layer over BEOL layer 20. The process of forming the via is illustrated in FIGS. 6 and 7. Referring first to FIG. 6, a lithographic material 54, such as a photoresist, may be deposited over the semiconductor structure 10. The lithographic material 54 may be patterned to expose one of the openings 46 in the sacrificial dielectric material 40 followed by an etching process, such as a RIE process, to etch through the dielectric material 48 and the cap layer 26. The result is a via opening 56 in which the underlying wiring trench 24 is exposed. After conventionally stripping the lithographic material 54, the resulting semiconductor structure is shown in FIG. 7. In one preferred exemplary embodiment, the walls 32 of the dielectric material 48 were not removed when the via opening 56 was etched.

Figure 8:
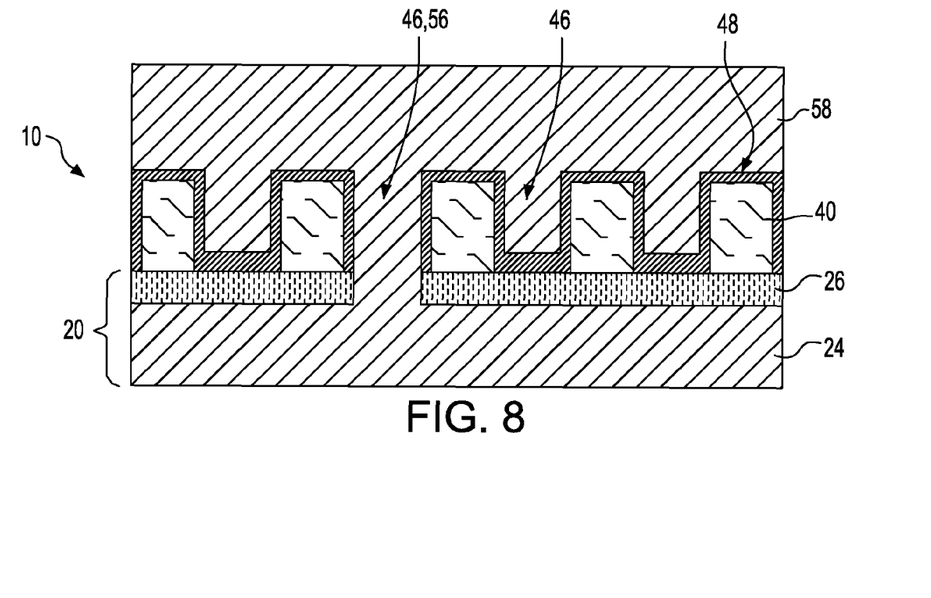
FIG. 8 is a crossectional view illustrating the deposition of a metal into the via opening and openings in the sacrificial dielectric material to form wiring trenches.

In a next process, the semiconductor structure 10 may be metallized. A liner (not shown), such as TaN/Ta, may be formed in the via opening 56 and openings 46 in the sacrificial dielectric material 40 followed by seed plating (not shown) and then filling with the metal 58 as shown in FIG. 8. In one exemplary embodiment, the preferred metal for the seed plating and the fill is copper.

Figure 9:
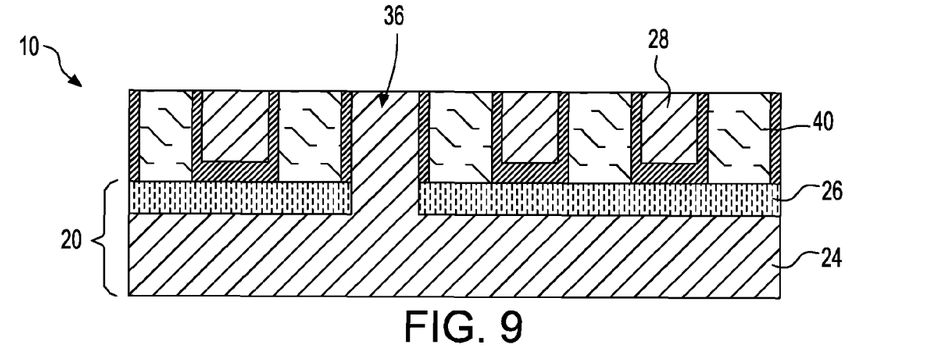
FIG. 9 is a crossectional view illustrating the planarization of the semiconductor structure of FIG. 8.

After deposition of the fill metal 58, the semiconductor structure 10 may undergo a planarization process, such as chemical mechanical polishing (CMP), to remove the overburden of the metal fill 58 and also remove the horizontal portions of the dielectric material 48 to result in the semiconductor structure 10 shown in FIG. 9. The semiconductor structure 10 now includes a via 36 and wiring trenches 28.

The sacrificial dielectric material 40 may be partially or completely removed. In one exemplary embodiment, as illustrated in FIGS. 10A to 10C, the sacrificial dielectric material 40 is only removed from some portions of the semiconductor structure 10 during the formation of this BEOL layer. Referring first to FIG. 10A, a partial cap layer 60 is formed over portions of the semiconductor structure 10 in which the sacrificial dielectric material 40 is not to be removed. The partial cap layer 60 may be, for example, a nitride and have a thickness of about 20-50 nm. Then, as illustrated in FIG. 10B, the sacrificial dielectric material 40 is etched away from those portions of the semiconductor structure 10 not protected by the cap layer 60. The sacrificial dielectric material 40 may be, for example, wet etched using hydrofluoric acid. After removal of the sacrificial dielectric material 40, airgaps 12 are formed. In one exemplary embodiment, the airgaps 12 extend all the way to the cap layer 26 and have a depth that is greater than that of the neighboring wiring trenches 28. It is noted that the airgaps 12 typically share a common dielectric wall 32 with the wiring trenches 28 but, as also shown in FIGS. 10B and 10C, may also share a common dielectric wall 32 with via 36. Lastly, a final cap layer 64 is deposited over the semiconductor structure 10 to pinch off (or close off) the airgaps 12. The final cap layer 64 may also be, for example, a nitride and have a thickness of about 20-50 nm. The final cap layer 64 may also cover the previous cap layer 60. The second BEOL layer 22 is now complete.

In another exemplary embodiment, as illustrated in FIGS. 11A to 11B, the sacrificial dielectric material 40 is removed from all of the semiconductor structure 10 during the formation of this BEOL layer. Referring to FIG. 11A, the sacrificial dielectric material 40 is etched away as described previously to result in airgaps 12. In one exemplary embodiment, the airgaps 12 extend all the way to the cap layer 26 and have a depth that is greater than that of the neighboring wiring trenches 28. It is noted that the airgaps 12 typically share a common dielectric wall 32 with the wiring trenches 28 but, as also shown in FIGS. 11A and 11B, may also share a common dielectric wall 32 with via 36. Lastly, a final cap layer 64 is deposited over the semiconductor structure 10 to pinch off (or close off) the airgaps 12. The final cap layer 64 may also be, for example, a nitride and have a thickness of about 20-50 nm. The second BEOL layer 22 is now complete.

Figure 12:
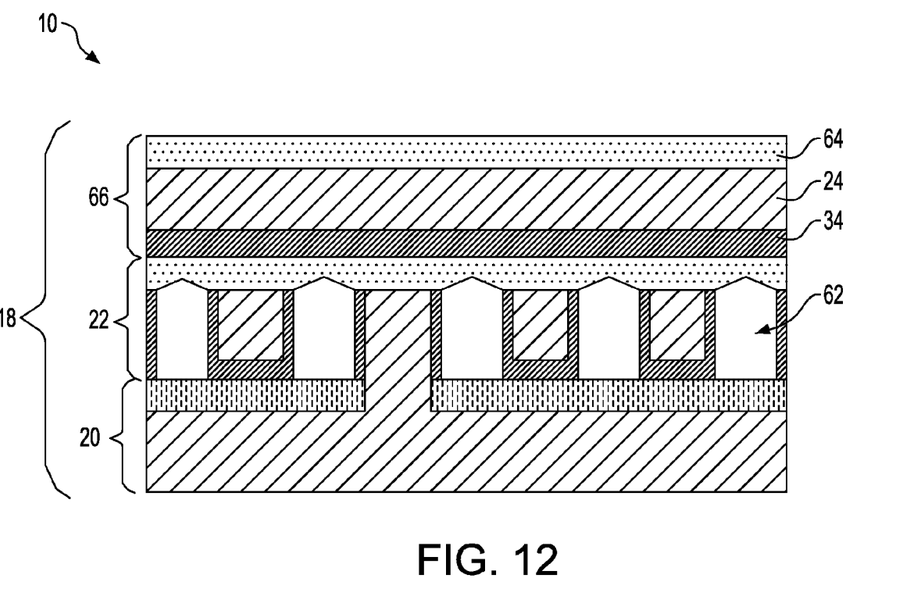
FIG. 12 is a crossectional view of another exemplary embodiment of a semiconductor structure having airgaps.

Referring now to FIG. 12, a third BEOL layer 66 has been added to semiconductor structure 10. The third BEOL layer 66 illustrates a wiring trench 24 and a final capping layer 64. Because the cross sectional view is through the wiring trench 24, the airgaps 12 are not visible but they may be present in BEOL layer 66.

Referring now to FIGS. 13 to 20, there is illustrated an alternative process for forming the trenches 28 and a via 36 of FIG. 1 in a semiconductor structure 10'.

The semiconductor base 14 and MOL portion 16 are not shown in FIGS. 13 to 20 for clarity.

The process for forming the semiconductor structure 10' of FIGS. 13 to 20 is similar to the process for forming semiconductor structure 10 of FIGS. 2 to 9 except for the presence of a hardmask 70, such as titanium nitride for example, used in the formation of semiconductor structure 10'.

Figure 13:
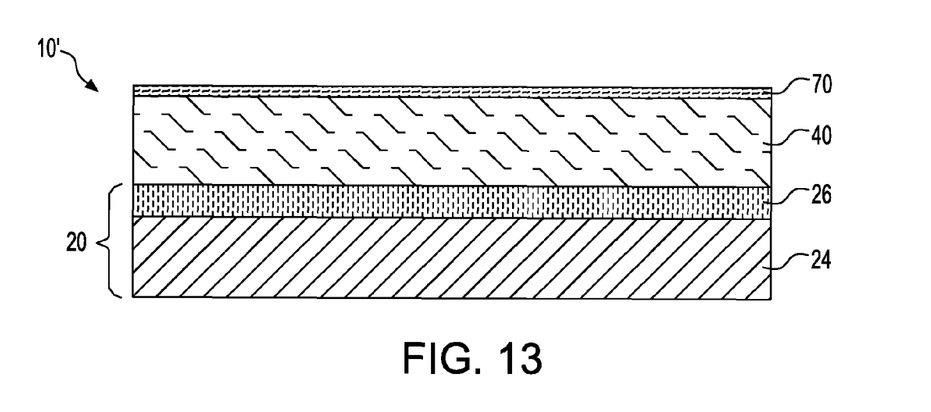
FIG. 13 is a crossectional view illustrating the formation of a hardmask layer and a sacrificial dielectric layer on a cap layer of a previous BEOL layer.

Referring to FIG. 13, BEOL layer 20 has been formed including wiring trench 24 and cap layer 26.

On top of cap layer 26 may be formed, for example by chemical vapor deposition (CVD) a sacrificial dielectric layer 40 as described previously.

On top of sacrificial dielectric layer 40 is formed hardmask 70.

Figure 14:
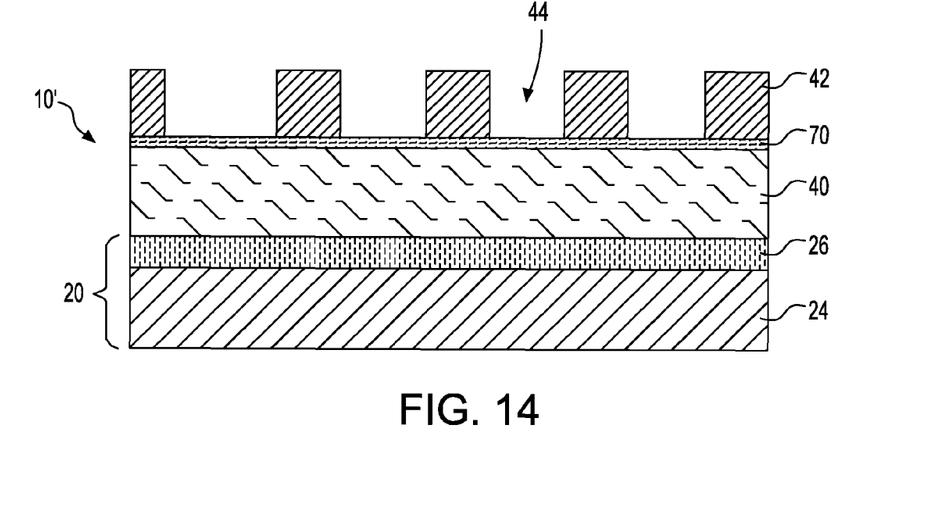
FIG. 14 is a crossectional view illustrating the patterning of a lithographic material on the hardmask layer.

Referring now to FIG. 14, a lithographic material 42 such as a photoresist has been deposited on the hardmask 70 and then patterned to form openings 44. Openings 44 are where the wiring trenches will be formed in subsequent processing steps.

Figure 15:
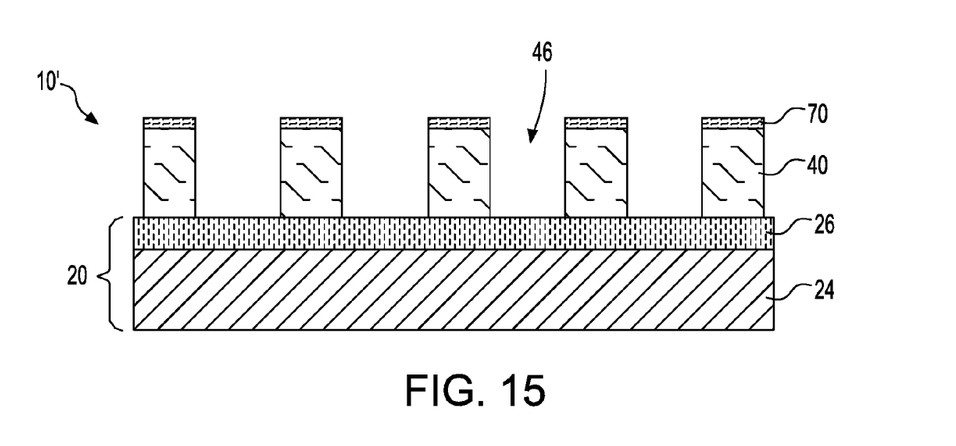
FIG. 15 is a crossectional view illustrating the etching of the hardmask layer and the sacrificial dielectric layer using the patterned lithographic material of FIG. 14 to form openings in the hardmask layer and the sacrificial dielectric material.

Thereafter, as shown in FIG. 15, the semiconductor structure 10' undergoes an etching process in which the openings 44 in the lithographic material 42 are propagated into the underlying hardmask 70 and sacrificial dielectric material 40 to form openings 46 in the now patterned hardmask 70 and sacrificial dielectric material 40. After the etching process, the lithographic material 42 may be conventionally stripped. As a result of the etching process, pillars of sacrificial dielectric material 40 topped by the patterned hardmask 70 are formed which will run parallel to the wiring trenches that will be formed in subsequent processing steps.

Figure 16:
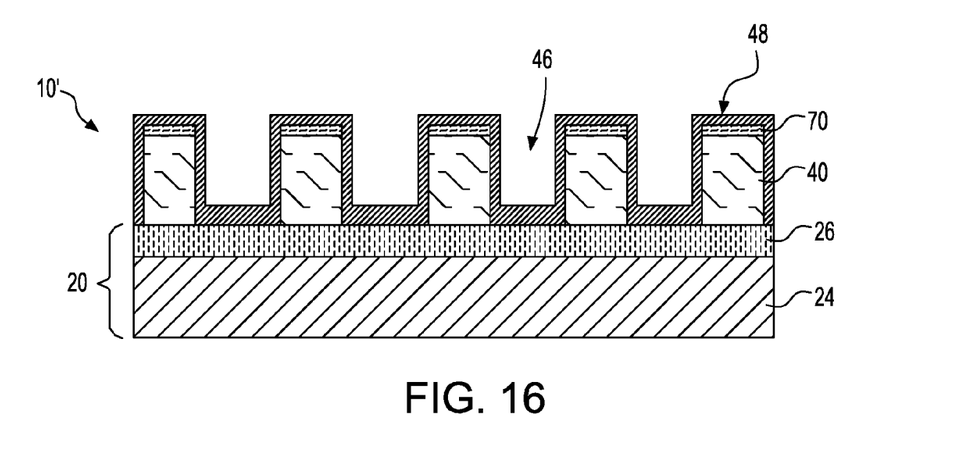
FIG. 16 is a crossectional view illustrating the formation of a conformal dielectric material in the openings of the patterned hardmask layer and the sacrificial dielectric material.

Then, as illustrated in FIG. 16, a dielectric material 48, such as an oxide, is conformally formed on the pillars of the patterned hardmask 70 and sacrificial dielectric material 40 and in the openings 46 of the sacrificial dielectric material 40.

The dielectric material may be deposited in two different ways to result in the conformally formed dielectric material 48. In one exemplary embodiment, the dielectric material 48 may be conformally deposited such as by a CVD process.

Figure 22A:
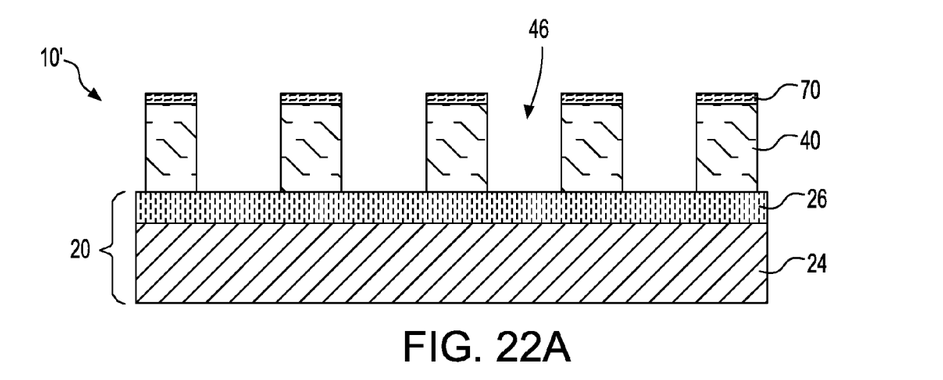
FIG. 22A, FIG. 22B and FIG. 22C are crossectional views illustrating another exemplary embodiment for forming a conformal dielectric layer using a flowable dielectric material.
Figure 22B:
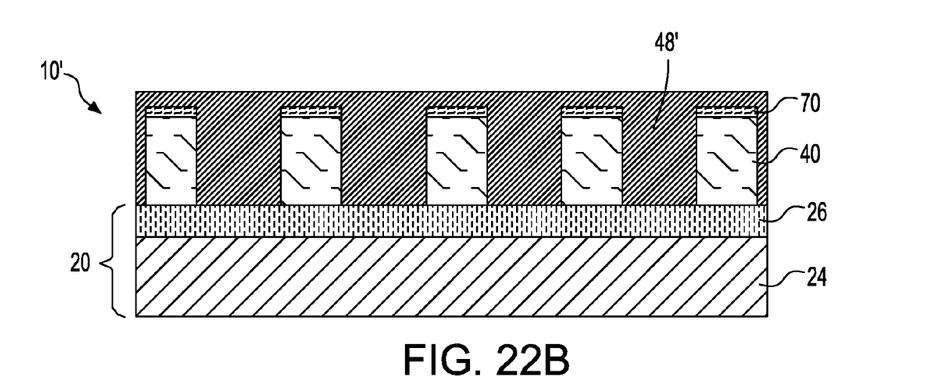
Figure 22C:
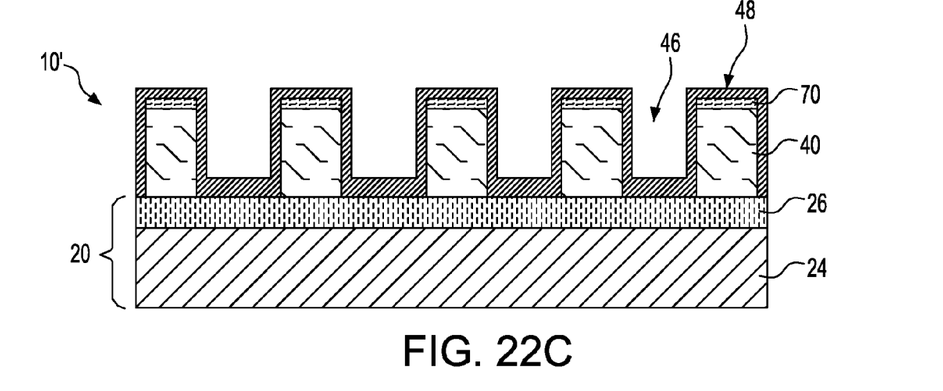

In another exemplary embodiment, as illustrated in FIGS. 22A to 22C, a flowable dielectric may be used followed by an etching process to result in the conformally formed dielectric material 48. FIG. 22A is the same as FIG. 15. In FIG. 22B, a flowable dielectric material 48' as described previously has been deposited over the sacrificial dielectric material 40 and in the openings 46. The patterned hardmask 70 may be used to etch the flowable dielectric material 48' to result in the conformally formed dielectric material 48 shown in FIG. 22C and also FIG. 16.

Alternatively, a combination of conformally deposited dielectric and a flowable dielectric may be used to achieve the desired thicknesses for the dielectric material 32 on the sidewall and the dielectric material 34 on the bottom.

Figure 17:
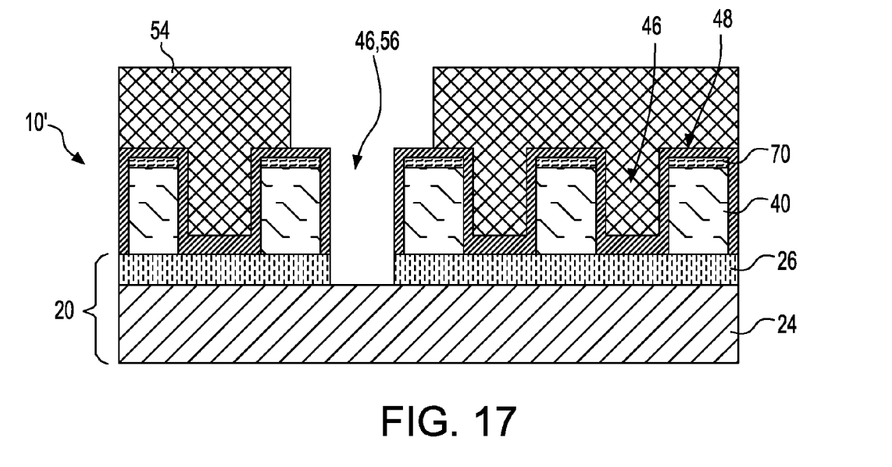
FIG. 17 is a crossectional view illustrating the patterning of a lithographic material and etching through the patterned lithographic material to form a via opening.
Figure 18:
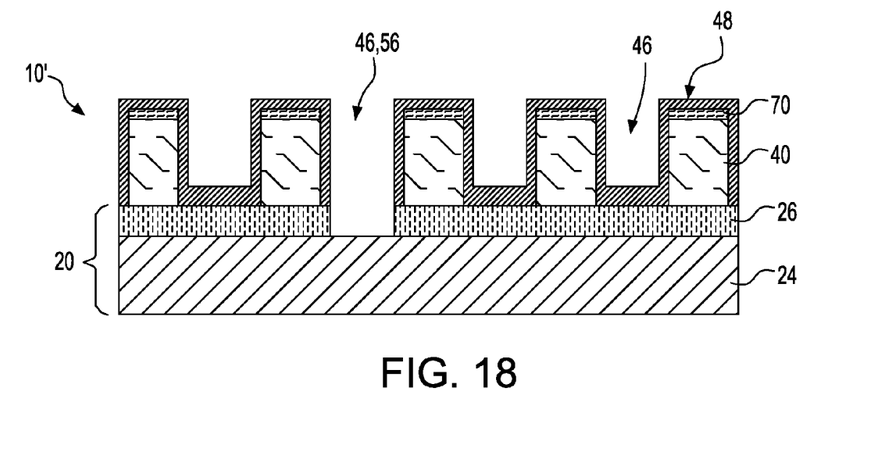
FIG. 18 is a crossectional view illustrating the semiconductor structure of FIG. 17 with the lithographic material removed.

In one exemplary embodiment, a via may be formed to connect wiring trench 24 in BEOL layer 20 to a wiring trench or a via in a BEOL layer over BEOL layer 20. The process of forming the via is illustrated in FIGS. 17 and 18. Referring first to FIG. 17, a lithographic material 54, such as a photoresist, may be deposited over the semiconductor structure 10'. The lithographic material 54 may be patterned to expose one of the openings 46 in the patterned hardmask 70 and sacrificial dielectric material 40 followed by an etching process, such as a RIE process, to etch through the dielectric material 48 and the cap layer 26. The result is a via opening 56 in which the underlying wiring trench 24 is exposed. After conventionally stripping the lithographic material 54, the resulting semiconductor structure is shown in FIG. 18.

A particular advantage of semiconductor structure 10' is that because of the presence of the patterned hardmask 70, the via pattern formed in the lithographic material 54 can be wider than the via opening 56. This allows for more aggressive patterning of vias.

Figure 19:
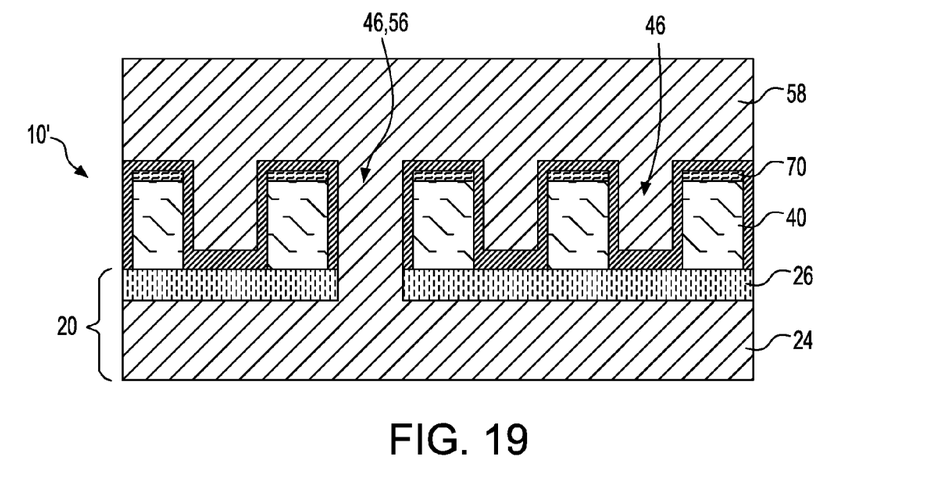
FIG. 19 is a crossectional view illustrating the deposition of a metal into the via opening and openings in the patterned hardmask layer and the sacrificial dielectric material to form wiring trenches.
Figure 20:
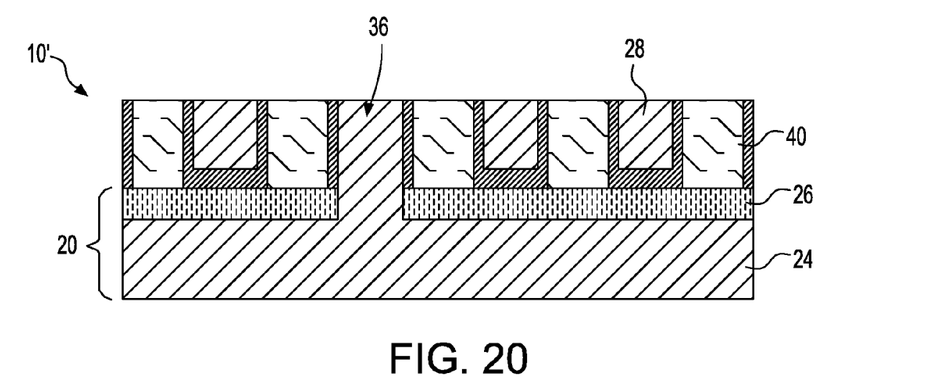
FIG. 20 is a crossectional view illustrating the planarization of the semiconductor structure of FIG. 19.

In a next process as shown in FIG. 19, the semiconductor structure 10' may be metallized as described previously. After deposition of the fill metal 58, the semiconductor structure 10 may undergo a planarization process, such as chemical mechanical polishing (CMP), to remove the overburden of the metal fill 58 and the horizontal portions of the dielectric material 48 and also remove the patterned hardmask 70 to result in the semiconductor structure shown in FIG. 20. The semiconductor structure 10' now includes a via 36 and wiring trenches 28.

Semiconductor structure 10' is now identical to semiconductor structure 10 in FIG. 9 and may be further processed as described in FIGS. 10A to 10C and 11A to 11B to form the airgaps 12.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming airgaps in a back end of the line (BEOL) wiring layer of a semiconductor device, comprising:
   providing a semiconductor substrate having a semiconductor base;
   depositing a sacrificial dielectric layer for a BEOL wiring layer on the semiconductor base;
   selectively etching the sacrificial dielectric layer to form openings in the sacrificial dielectric layer, each opening having walls and a bottom;
   conformally forming a dielectric material in the openings, the dielectric material conformally formed on the walls and the bottom of each of the openings;
   depositing a metal on the conformally formed dielectric material in the openings to form metal-filled openings;
   removing the sacrificial dielectric layer from at least a portion of the semiconductor substrate to form air gap openings extending to a level equal to the bottom of each of the openings, the air gap openings being adjacent to the metal-filled openings and sharing a common dielectric wall with each adjacent metal-filled opening; and
   forming a dielectric cap layer over the air gap openings to pinch off the air gap openings.

2. The method of claim 1 wherein after conformally forming the dielectric material in the openings, further comprising etching through the dielectric material in at least one of the openings to form a via opening to an underlying metallic feature and in the step of depositing the metal, further including depositing the metal in the via opening to form a via.

3. The method of claim 1 further comprising removing the sacrificial dielectric layer from all of the semiconductor substrate so that air gap openings replace all of the sacrificial dielectric layer.

4. The method of claim 1 wherein the metal is copper and the metal-filled openings are trenches.

5. The method of claim 1 wherein the conformally formed dielectric material is thicker on the bottom of each of the openings than on the walls of each of the openings.

6. The method of claim 1 wherein the conformally formed dielectric material is conformally deposited.

7. The method of claim 1 wherein conformally forming the dielectric material comprises depositing a flowable dielectric material to completely fill the openings and then selectively etching the flowable dielectric to form the conformally formed dielectric on the walls and the bottom of the openings.

8. The method of claim 1 wherein removing the sacrificial dielectric layer from at least a portion of the semiconductor base comprises forming a partial cap layer over a second portion of the semiconductor substrate where the sacrificial dielectric layer is not to be removed to leave the portion of the semiconductor substrate exposed and in the step of forming the dielectric cap layer, further comprising forming the dielectric cap layer on the partial cap layer.

9. A method of forming airgaps in a back end of the line (BEOL) wiring layer of a semiconductor device, comprising:
providing a semiconductor substrate having a semiconductor base and a dielectric cap layer in a BEOL wiring layer;
depositing a sacrificial dielectric layer on the dielectric cap layer;
selectively etching the sacrificial dielectric layer to form openings in the sacrificial dielectric layer to expose the dielectric cap layer such that the remaining sacrificial dielectric layer forms pillars of the sacrificial dielectric layer, each opening having walls and a bottom;
conformally forming a dielectric material in the openings, the dielectric material conformally formed on walls of the opening and the dielectric cap layer exposed in the openings;
depositing a metal on the conformally formed dielectric material in the openings to form metal-filled openings;
removing the pillars of the sacrificial dielectric layer from at least a portion of the semiconductor substrate to form air gap openings having walls of the dielectric material and exposing the dielectric cap layer, the air gap openings being adjacent to the metal-filled openings and sharing a common dielectric wall with each adjacent metal-filled opening; and
forming a second dielectric cap layer over the air gap openings to pinch off the air gap openings.

10. The method of claim 9 wherein after conformally forming the dielectric material in the openings, further comprising etching through the dielectric material and the dielectric cap layer in at least one of the openings to form a via opening to an underlying metallic feature and in the step of depositing the metal, further including depositing the metal in the via opening to form a via.

11. The method of claim 9 further comprising removing the pillars of the sacrificial dielectric layer from all of the semiconductor substrate so that air gap openings replace all of the pillars of the sacrificial dielectric layer.

12. The method of claim 9 wherein the metal is copper and the metal-filled openings are trenches.

13. The method of claim 9 wherein the conformally formed dielectric material is thicker on the bottom of each of the openings than on the walls of each of the openings.

14. The method of claim 9 wherein the conformally formed dielectric material is conformally deposited.

15. The method of claim 9 wherein conformally forming the dielectric material comprises depositing a flowable dielectric material to completely fill the openings and then selectively etching the flowable dielectric to form the conformally formed dielectric on the walls and the bottom of the openings.

16. The method of claim 9 wherein removing the sacrificial dielectric layer from at least a portion of the semiconductor base comprises forming a partial dielectric cap layer over a second portion of the semiconductor substrate where the sacrificial dielectric layer is not to be removed to leave the portion of the semiconductor substrate exposed and in the step of forming the second dielectric cap layer, further comprising forming the second dielectric cap layer on the partial cap layer.

17. A semiconductor structure comprising:
a semiconductor substrate having a semiconductor base and a plurality of back end of the line (BEOL) wiring layers;
a dielectric cap layer of uniform thickness on the semiconductor base;
a plurality of trenches on the dielectric cap layer, each of the trenches including dielectric walls, a dielectric bottom in contact with the dielectric cap layer and a metal filling a space between the dielectric walls;
a plurality of air gap openings on the dielectric cap layer and interspersed with the plurality of trenches, each air gap opening between the dielectric wall from one metal trench and adjacent to the dielectric wall of a second metal, the dielectric cap layer forming a bottom of the plurality of air gap openings, such that the plurality of air gap openings are directly exposed to the dielectric cap layer; and
a second dielectric cap layer formed over the plurality of trenches and over the plurality of air gap openings, the same second dielectric cap layer pinches off each air gap opening as is formed over the plurality of trenches.

18. The semiconductor structure of claim 17 further comprising a dielectric pillar between at least two adjacent trenches.

19. The semiconductor structure of claim 18 further comprising a third dielectric cap layer on the dielectric pillar, the third dielectric cap layer interposed between the dielectric pillar and the second dielectric cap layer.

20. The semiconductor structure of claim 17 wherein the dielectric walls have a first thickness and the dielectric bottom has a second thickness such that the second thickness is greater than the first thickness.

* * * * *